United States Patent [19]

Fujishima et al.

[11] Patent Number: 4,757,476

[45] Date of Patent: Jul. 12, 1988

[54] DUMMY WORD LINE DRIVING CIRCUIT FOR A MOS DYNAMIC RAM

[75] Inventors: Kazuyasu Fujishima; Masaki Kumanoya; Hideshi Miyatake; Hideto Hidaka; Katsumi Dosaka; Tsutomu Yoshihara, all of Itami, Japan

[73] Assignee: Mitsubishi Denki Kabushiki Kaisha, Tokyo, Japan

[21] Appl. No.: 876,912

[22] Filed: Jun. 20, 1986

[30] Foreign Application Priority Data

Jun. 21, 1985 [JP] Japan ................................ 60-136535

[51] Int. Cl.[4] ............................................. G11C 7/02
[52] U.S. Cl. ..................................... 365/210; 365/203
[58] Field of Search ............... 365/189, 203, 200, 210, 365/205

[56] References Cited

U.S. PATENT DOCUMENTS

| | | | |
|---|---|---|---|
| 4,122,546 | 10/1978 | von Basse et al. | 365/189 |
| 4,504,929 | 3/1985 | Takemae et al. | 365/210 |
| 4,547,868 | 10/1985 | Childers et al. | 365/203 |

FOREIGN PATENT DOCUMENTS

| | | |
|---|---|---|
| 3035260 | 4/1981 | Fed. Rep. of Germany . |
| 3236729 | 5/1983 | Fed. Rep. of Germany . |
| 3438069 | 5/1985 | Fed. Rep. of Germany . |

OTHER PUBLICATIONS

IEEE Journal of Solid-State Circuits, vol. SC-15, No. 5, Oct. 1980, pp. 839-846, J. Y. Chan et al., "A 100 ns 5 V Only 64K×1 MOS Dynamic RAM".

Primary Examiner—Joseph A. Popek
Attorney, Agent, or Firm—Lowe, Price, Leblanc, Becker & Shur

[57] ABSTRACT

A dummy word line driving circuit for a MOS dynamic RAM comprises a dummy word line controller connected to each end of a pair of dummy word lines. A sub-decode signal which is opposite to the one inputted to a dummy word driver and a dummy set signal for writing a bit line information into a not-selected dummy cell are inputted to the dummy word line controller. Means for applying a dummy equalizing signal is connected to two full-sized dummy cells, for equalizing the two before the dummy word line is driven. The two full-sized dummy cells are equalized by the signal, resulting in a charge amount, which is to be a reference value, of a half of a full-sized memory cell.

3 Claims, 4 Drawing Sheets

DUMMY WORD LINE DRIVING CIRCUIT FOR A MOS DYNAMIC RAM

BACKGROUND OF THE INVENTION

1. Field of the Invention

The present invention relates to a dummy word line driving circuit for a MOS dynamic RAM.

2. Description of the Prior Art

In a one-transistor type MOS dynamic RAM, whether a charge is stored or not in the MOS capacitor corresponds to the information "1" or "0".

The structure of a conventional memory array of a MOS dynamic RAM is shown in FIG. 3. In the figure, 1 denotes a memory cell composed of a memory capacitor having a capacitance of Cs and a MOS transistor. A voltage signal which is transmitted from the memory cell to a sense amplifier 2, namely, a signal voltage appears on a bit line BL or a bit line $\overline{BL}$, is determined by the proportion of the amount of a signal charge Qs stored in the memory capacitor to the stray capacitance Cb of the bit line. Now, assuming that the voltage written in the memory capacitor is at the source voltage level Vcc(V) when the information is "1", and that the voltage is at the ground level 0(V) when the information is "0", the difference $\Delta V$ between the signal voltage of "1" and "0" is represented as follows: $\Delta V = Cs \, Vcc/(Cs+Cb)$. The information "1" or "0" is determined by a comparison between the signal voltage Vcc(V) or 0(V) and the reference voltage read out from a dummy cell 4 at the sense amplifier 2. Therefore, the dummy cell 4 is composed so as to employ a half of the capacitance value Cs/2 of the memory capacitor as a dummy capacitor, so that 0(V) is always written therein.

The operation of a conventional memory cell will be described with reference to the structure of FIG. 3 and a diagram of waveform in FIG. 4. First, one X decoder is selected from a plurality of X decoders 5 according to an address input, and one word line $WL_0$ is selectively driven by a word driver 7 according to a signal $\phi X_0$, which is a sub-decoded signal of a word line driving signal $\phi X$ (here, description of one example will be given in which a word line $WL_0$ is selected).

On this occasion, a dummy word line $DWL_0$ is driven by a dummy word driver 9-2 simultaneously. Consequently, the information stored in the memory capacitor is transferred to the bit line BL, while the information stored in the dummy capacitor is transferred to the bit line $\overline{BL}$. A subtle potential difference between the two is differentially amplified by the sense amplifier 2. An active restore circuit 10, which is connected to the sense amplifier 2, restores the dropped voltage of the bit line on the high-level side which is generated during the differential amplification to the level of the source voltage Vcc. Meanwhile, a signal $\phi DR$ is a dummy reset signal which writes 0(V) into the dummy capacitor, a signal $\phi WR$ is a word reset signal which discharges the voltage of the selectively driven word line at the end of the memory cycle.

In a conventional structure as described above, the capacitance of the dummy capacitor of the dummy cell 4 is required to be a half of the capacitance of the memory capacitor. Therefore, if a memory having a large memory capacity comes to be implemented by decreasing the size of each of the cells in a chip and thus increasing the number of cells in a chip, it will be difficult to lay out the dummy capacitors. In addition, the size of the dummy cell 4 defines the degree of integration of the memory, resulting in a drawback that it is obstructive to the implementation of a memory of high density.

SUMMARY OF THE INVENTION

The present invention comprises a dummy word line controller connected to the end of the dummy word line to which a sub-decode signal which is opposite to the one inputted to the dummy word driver and a dummy set signal for writing the bit line information into a not-selected dummy cell are inputted, and a means for applying a dummy equalizing signal connected to two dummy cells for equalizing the two before the dummy word line is driven.

The logics "1" and "0" are written, respectively, into two dummy cells (full-sized dummy cells), which has dummy capacitors of the same size as memory capacitors and connected to a pair of bit lines, by the dummy word line controller from the bit lines. The capacitances corresponding to the logics written in the dummy capacitors are equalized to gain a half of the signal charge amount before the word line is driven.

Therefore, according to the present invention, the capacitance value of the dummy capacitor in the dummy cell need not be a half of the capacitance value of the memory capacitor in the memory cell, avoiding the problem that the degree of integration of the memory is defined by the size of the dummy cell. According to the present invention, the degree of integration of the memory can be defined by the size of the memory cell itself. Namely, since the memory cell can be formed with minimum pattern, the degree of integration of the memory can be increased.

The dummy word driver of the present invention employs the same circuit as the word driver and laid out in the same manner as the word driver, so that the signal transmission property of the word line and the dummy word line can be made uniform, enabling the stable operation of the memory.

The present invention further provides an advantage that even if the finished size of the capacitor become uneven during the manufacturing process, precisely a half reference voltage can be generated by equalizing the dummy capacitors.

In addition, the dummy word line controller is driven for raising the not-selected dummy word line with the dummy word driver separated effectively, so that the operation of the memory will not be adversely affected.

DESCRIPTION OF PREFERRED EMBODIMENTS

One embodiment of this invention will be hereinafter described with reference to the drawings.

Figure 1:
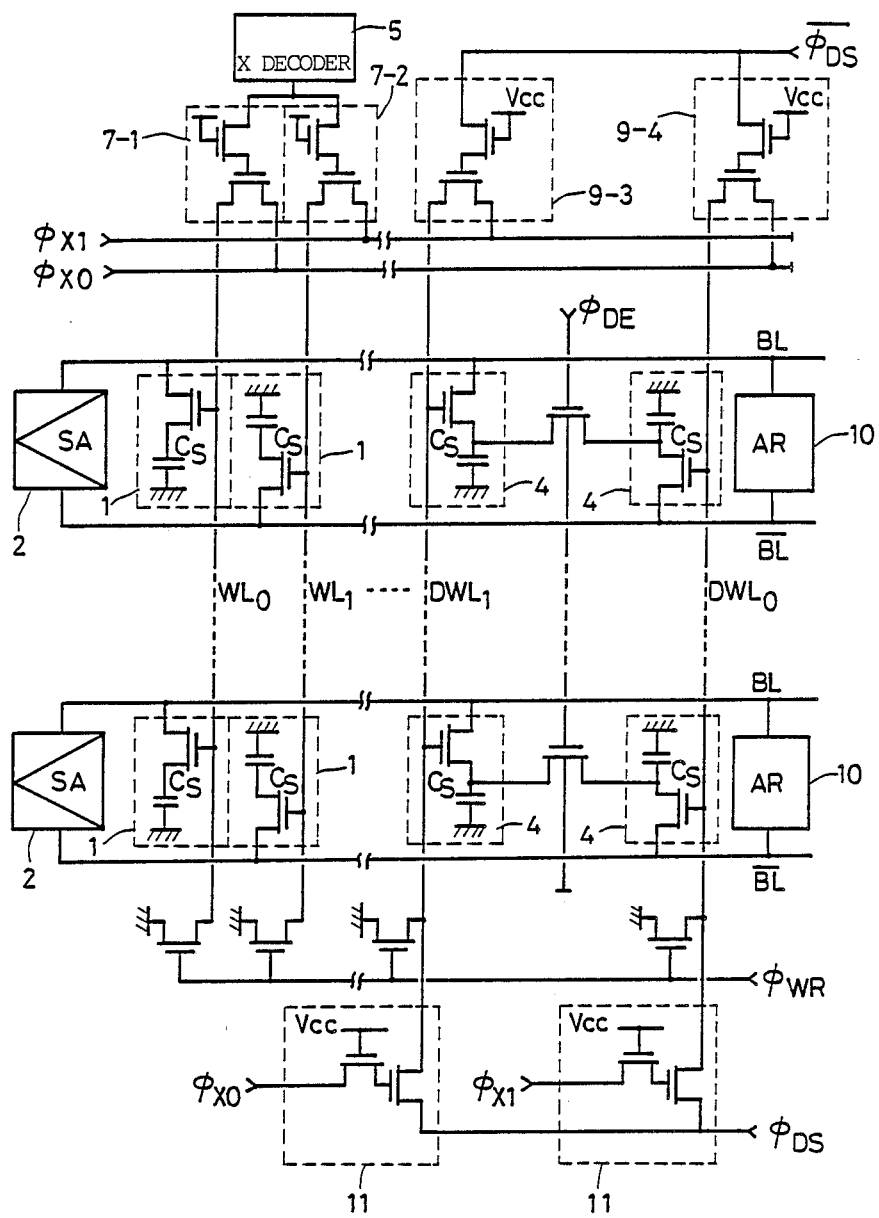
FIG. 1 is a schematic diagram of a MOS dynamic RAM having the dummy word line driving circuit according to one embodiment of this invention.
Figure 2:
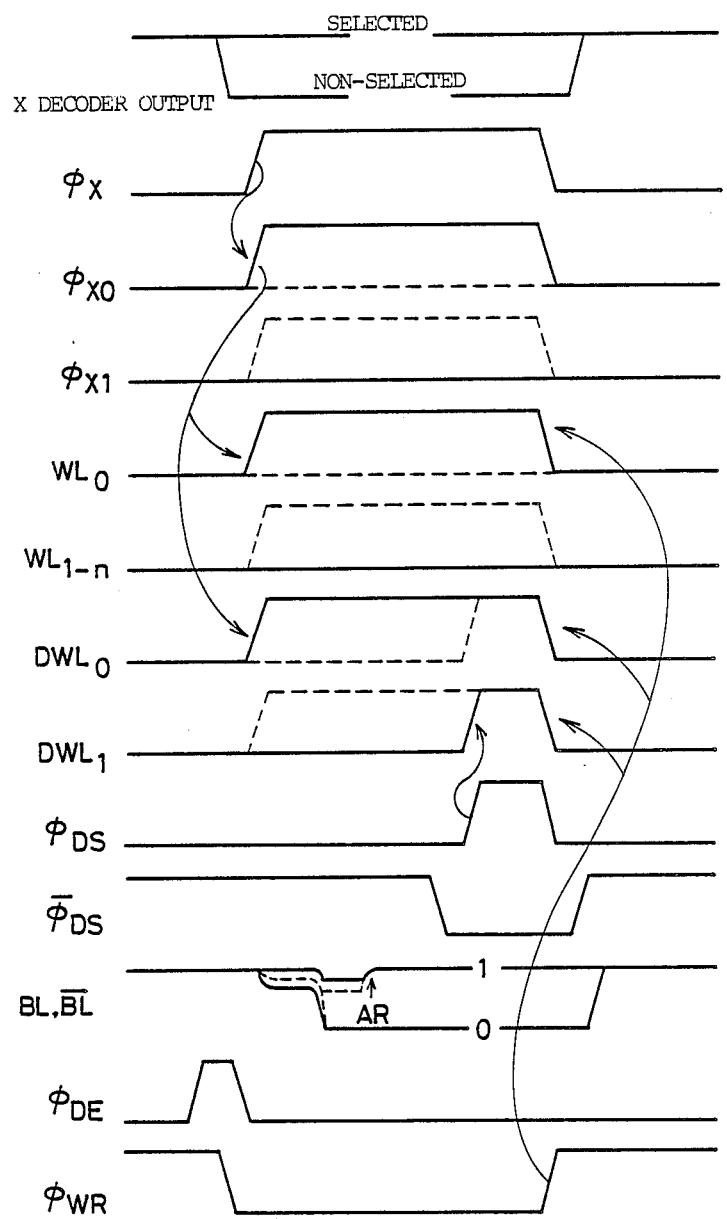
FIG. 2 is a diagram of waveforms for describing the operation of the dummy word line driving circuit according to one embodiment of this invention.
Figure 3:
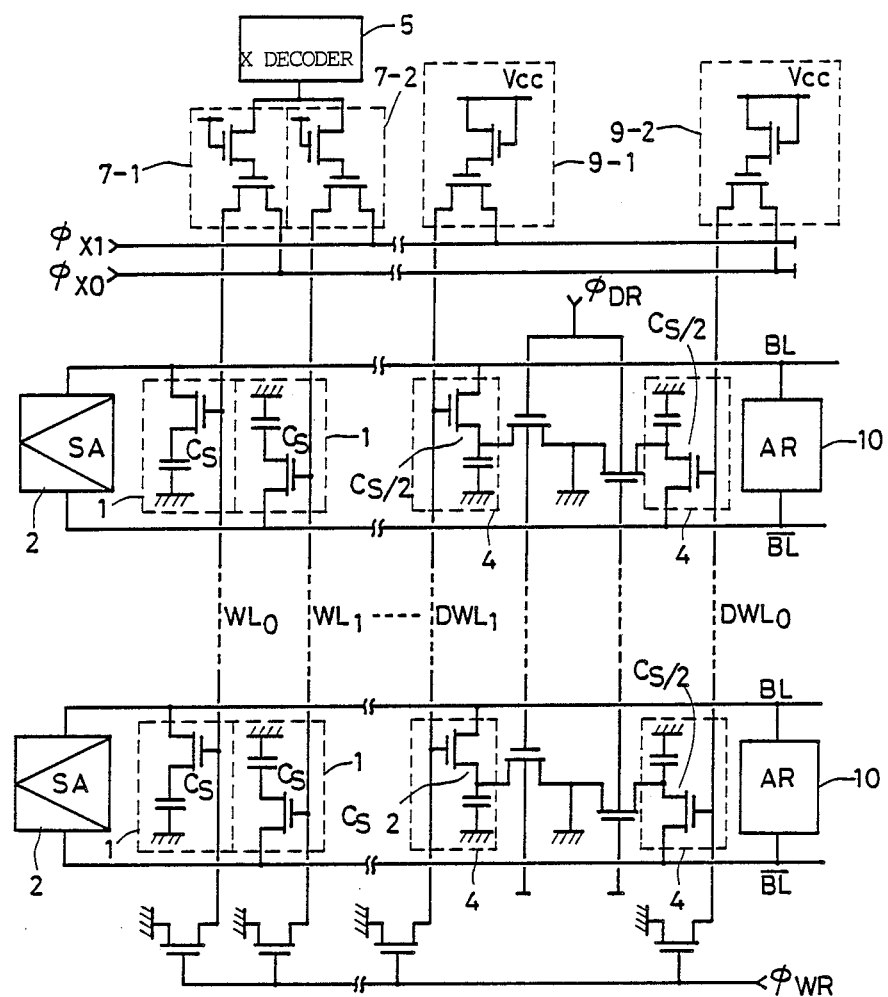
FIG. 3 is a schematic diagram of a MOS dynamic RAM having a conventional dummy word line driving circuit.
Figure 4:
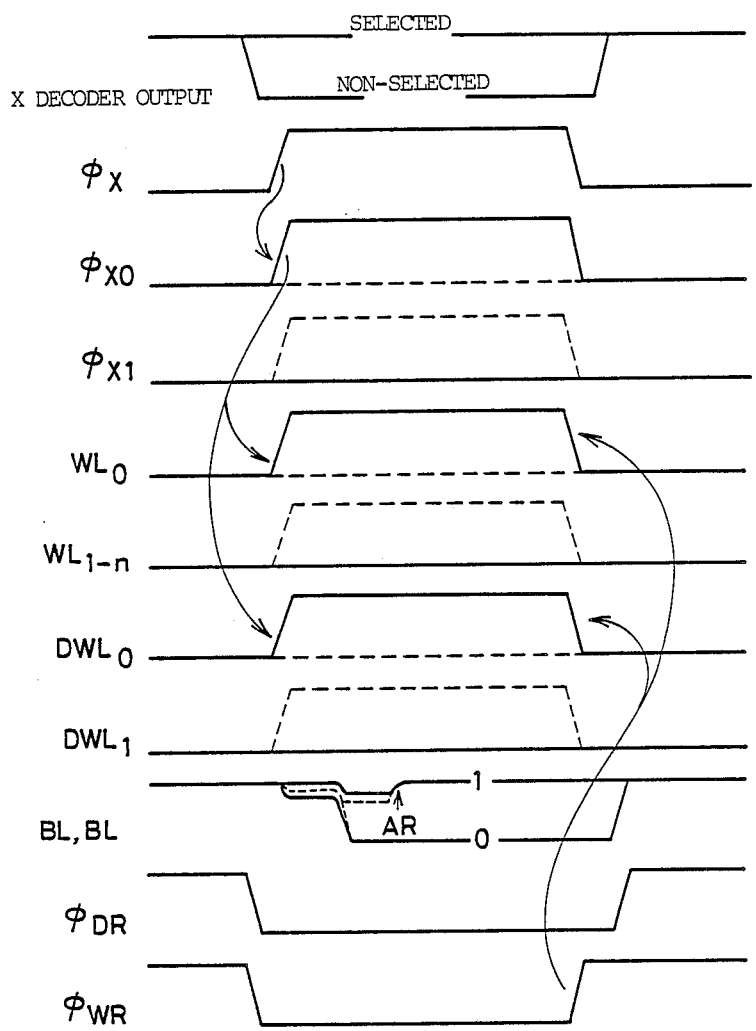
FIG. 4 is a diagram of waveforms for describing the operation of a conventional MOS dynamic RAM.

FIG. 1 is a schematic diagram of a memory array according to one embodiment of this invention; FIG. 2 is a diagram of waveforms describing the operation of the memory array of FIG. 1. The waveforms of FIG. 2 represent the case where the word line WL$_0$ is selected as an example. In this embodiment, the operation of the memory cell is similar to that of the conventional memory cell described above, and the description thereof is omitted.

In the circuit of this invention, dummy word line controllers 11 are connected to the ends of dummy word lines DWL$_0$ and DWL$_1$, respectively. A sub-decode signal $\phi X_0$ or $\phi X_1$ which is opposite to the one inputted to the dummy word driver 9-3 and 9-4, and a dummy set signal $\phi DS$ for writing the bit line information into the not-selected dummy cell are inputted to each of the dummy word line controllers 11. The dummy set signal $\phi DS$ reaches a high level after a sense amplifier 10 is activated, and it drops to a low level almost simultaneously with the word line driving signal $\phi X$. The bit line information which corresponds to the selected dummy cell 4 is written into the not-selected dummy cell 4 by this dummy set signal $\phi DS$.

The dummy capacitor included in the dummy cell 4 is adapted to have the same capacitance value Cs as the memory capacitor. The electric charges corresponding to the logics "1" and "0" written in the two dummy capacitors are equalized by the dummy equalizing signal $\phi DE$ before the word line (dummy word line) is driven, to have a half reference charge of the signal charge of the memory cell. Namely, the dummy equalizing signal $\phi DE$ reaches the high level in order to equalize the dummy capacitors when the signals of all lines are at the low level.

In this embodiment, a dummy set bar signal $\overline{\phi DS}$ is inputted to the dummy word drivers 9-3 and 9-4, respectively, which is at the high level at the time of rising the word line WL (and the dummy word line DWL), falls to the low level before the rising of the dummy set signal $\phi DS$, and remains at the low level while the dummy set signal $\phi DS$ remains at the high level. Accordingly, the not-selected dummy cell 4 is separated from the line of the signal $\phi X1$ at the dummy word driver 9-3 by the dummy set bar signal $\overline{\phi DS}$, so that the high level signal on the dummy word line DWL 1 is prevented from affecting the line of the signal $\phi X1$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dummy word line driving circuit for a MOS dynamic RAM which determines the memory cell information "1" or "0" stored by a memory cell, said memory cell including a memory capacitor, by comparing an output signal voltage from said memory cell connected to a one of first and second bit lines with an output reference voltage from a one of first and second dummy cells connected to the other of said first and second bit lines, comprising first and second dummy capacitors included as part of each said first and second dummy cells, respectively, each said first and second dummy capacitors substantially the same size as said memory capacitor;

first and second dummy word lines connected to each of said first and second dummy cells, respectively, for selecting a one of said first and second dummy cells;

first and second sub-decode signals;

a dummy set signal;

first and second dummy word drivers connected to one end of each said first and second dummy word lines, respectively, for selectively driving a one of said first and second dummy word lines, said first and second dummy word drivers having as an input said first and second sub-decode signals, respectively;

first and second dummy word line controllers, each having inputted a one of said first and second sub-decode signals, respectively, said first and second dummy word line controllers further having inputted said dummy set signal for writing information carried by said bit line into a not-selected dummy cell; and equalizing signal output means connected to each of said first and second dummy cells, respectively, which outputs a signal to cause a reference charge to be stored in each said first and second dummy capacitors which is a half of a signal charge stored by said memory capacitor, before said first and second dummy word lines are driven.

2. A dummy word line driving circuit for a MOS dynamic RAM according to claim 1, wherein a dummy set bar signal, complementary to said dummy set signal, is inputted to said dummy work line driver, said dummy set bar signal being at a high level upon an associated one of said first and second dummy word lines going high, and falls to a low level prior to said first dummy set signal going high, isolating a not-selected one of said first and second dummy word lines from said sub-decode signal in response to said dummy set signal to prevent a signal on the not-selected one of said first and second dummy word lines from affecting said sub-decode signal and other signal lines.

3. A dummy word line driving circuit for a MOS dynamic RAM according to claim 1, wherein each said first and second dummy word line controllers is connected to the other end of each said first and second dummy word drivers, respectively.

* * * * *